US012757597B2

(12) United States Patent
Lee et al.

(10) Patent No.: US 12,757,597 B2
(45) Date of Patent: Oct. 6, 2026

(54) DISPLAY PANEL HAVING IMPROVED LIGHT-EMITTING STRUCTURE

(71) Applicants: KunShan Go-Visionox Opto-Electronics Co., Ltd, Kunshan (CN); Hefei Visionox Technology Co., Ltd., Hefei (CN)

(72) Inventors: Chung-Chun Lee, Kunshan (CN); Yuan Yao, Kunshan (CN); Yiming Xiao, Kunshan (CN)

(73) Assignees: KunShan Go-Visionox Opto-Electronics Co., Ltd, Kunshan (CN); Hefei Visionox Technology Co., Ltd., Hefei (CN)

( * ) Notice: Subject to any disclaimer, the term of this patent is extended or adjusted under 35 U.S.C. 154(b) by 185 days.

(21) Appl. No.: 18/610,778

(22) Filed: Mar. 20, 2024

(65) Prior Publication Data

US 2025/0294979 A1 Sep. 18, 2025

(30) Foreign Application Priority Data

Mar. 15, 2024 (CN) ......................... 202410302649.2

(51) Int. Cl.

| | |
|---|---|
| ***H10K 59/131*** | (2023.01) |
| ***H10K 59/121*** | (2023.01) |
| ***H10K 59/122*** | (2023.01) |
| ***H10K 59/123*** | (2023.01) |
| ***H10K 59/35*** | (2023.01) |
| ***H10K 59/80*** | (2023.01) |
| ***H10K 71/00*** | (2023.01) |

(52) U.S. Cl.

CPC ......... *H10K 59/131* (2023.02); *H10K 59/121* (2023.02); *H10K 59/122* (2023.02); *H10K 59/123* (2023.02); *H10K 59/352* (2023.02); *H10K 59/353* (2023.02); *H10K 59/80515* (2023.02); *H10K 59/80522* (2023.02); *H10K 71/861* (2023.02)

(58) Field of Classification Search

CPC ........... H10K 59/80515; H10K 59/121; H10K 59/131

See application file for complete search history.

(56) References Cited

FOREIGN PATENT DOCUMENTS

| | | |
|---|---|---|
| CN | 109656070 A | 4/2019 |
| CN | 109742121 A | 5/2019 |
| CN | 111180499 A | 5/2020 |

(Continued)

OTHER PUBLICATIONS

Office Action issued on Aug. 25, 2025, in corresponding Korean Application No. 10-2024-0072285, 29 pages.

(Continued)

*Primary Examiner* — Daniel Luke
(74) *Attorney, Agent, or Firm* — Maier & Maier, PLLC

(57) ABSTRACT

A display panel, a display device, and a method for repairing a display panel. The display panel includes: a substrate; a driving device layer disposed on the substrate; a light-emitting structure disposed on a side of the driving device layer away from the substrate. The light-emitting structure includes two or more first electrodes and light-emitting function structures respectively disposed at a side of the first electrodes away from the substrate and spaced apart, the two or more first electrodes are spaced apart and connected to each other by a first wire, and the first wire is located between two adjacent first electrodes.

7 Claims, 7 Drawing Sheets

(56) References Cited

FOREIGN PATENT DOCUMENTS

| | | | |
|---|---|---|---|
| CN | 113707694 | A | 11/2021 |
| CN | 114089566 | A | 2/2022 |
| CN | 116685174 | A | 9/2023 |
| CN | 113707694 | B | 12/2023 |
| CN | 117479629 | A | 1/2024 |
| CN | 118742138 | A | 10/2024 |
| CN | 119110610 | A | 12/2024 |
| CN | 119136583 | A | 12/2024 |
| CN | 120076633 | A | 5/2025 |
| JP | 2003273397 | A | 9/2003 |
| JP | 2005116709 | A | 4/2005 |
| JP | 2010107933 | A | 5/2010 |
| JP | 2014235853 | A | 12/2014 |
| JP | 2015043009 | A | 3/2015 |
| JP | 2015079755 | A | 4/2015 |
| JP | 2017504676 | A | 2/2017 |
| JP | 2018107440 | A | 7/2018 |
| KR | 1020230171727 | A | 12/2023 |
| WO | 2024198433 | A1 | 10/2024 |

OTHER PUBLICATIONS

Office Action issued Feb. 10, 2025, in corresponding Japanese Application No. 2024-090742, 9 pages.

Notice of Allowance issued May 26, 2025, in corresponding Japanese Application No. 2024-090742, 6 pages.

Office Action issued on Feb. 22, 2025, in corresponding Chinese Application No. 202410302649.2, 22 pages.

Office Action issued on Feb. 18, 2025, in corresponding Japanese Application No. 2024-090742, 6 pages, with partial English translation.

DISPLAY PANEL HAVING IMPROVED LIGHT-EMITTING STRUCTURE

CROSS REFERENCE TO RELATED APPLICATION

The present application claims priority to Chinese Patent Application No. 202410302649.2 filed on Mar. 15, 2024, and titled "DISPLAY PANEL, DISPLAY DEVICE, AND METHOD FOR REPAIRING DISPLAY PANEL", which is incorporated herein by reference in its entirety.

TECHNICAL FIELD

The present application relates to a technical field of a display device, and particularly relates to a display panel having an improved light-emitting structure.

BACKGROUND

Flat panel display devices based on technologies such as Organic Light emitting Diode (OLED) and Light emitting Diode (LED) have advantages of high quality, power saving, thin body and wide application range, and are widely used in mobile phones, TVs, laptops, desktop computers and other consumer electronic products, which thus become the mainstream of the display devices.

However, it is necessary to improve the display performance of the current OLED display products.

SUMMARY

The embodiments of the present application provide a display panel, a display device, and a method for repairing a display panel.

The embodiments of a first aspect of the present application provide a display panel, including: a substrate; a driving device layer disposed on the substrate; a light-emitting structure disposed on a side of the driving device layer away from the substrate, wherein the light-emitting structure includes two or more first electrodes and light-emitting function structures respectively disposed at a side of the first electrodes away from the substrate and spaced apart, the two or more first electrodes are spaced apart and connected to each other by a first wire, and the first wire is located between two adjacent first electrodes.

The embodiments of the first aspect of the present application further provide a display panel, including: a substrate; a driving device layer disposed on the substrate; a light-emitting structure disposed on a side of the driving device layer away from the substrate and defining a first region and a second region independent of each other, wherein the light-emitting structure includes two or more first electrodes and light-emitting function structures respectively disposed at a side of the first electrodes away from the substrate and spaced apart, the two or more first electrodes and the light-emitting function structures are located in the first region and the second region respectively, the two or more first electrodes are spaced apart and connected to each other by a first wire, and the first wire is located between two adjacent first electrodes; an isolation structure disposed on the side of the driving device layer away from the substrate, wherein the isolation structure defines a plurality of first openings, and the light-emitting function structures are isolated by the isolation structure and located in the first openings respectively.

According to any of the above implementations of the first aspect of the present application, a material of the pixel definition layer includes a light transmittance material.

The embodiments of the first aspect of the present application further provide a display panel including a substrate, a plurality of sub-pixels disposed on the substrate, and an isolation structure, wherein at least one of the sub-pixels includes two or more pixel blocks, two adjacent pixel blocks are spaced apart by the isolation structure, each of the pixel blocks includes a first electrode and a light-emitting function structure located on a side of the first electrode away from the substrate, and at least two first electrodes are connected with each other through a first wire.

In the display panel provided by the embodiments of the present application, the display panel includes the substrate, the driving device layer disposed on the substrate, and the light-emitting structure. The light-emitting structure includes two or more first electrodes and two or more light-emitting function structures. That is, the same light-emitting structure is divided into at least two portions. The two or more first electrodes of the same light-emitting structure are spaced apart and connected to each other through the first wire, so that the two or more first electrodes of the same light-emitting structure can be connected to the same driving unit of the driving device layer through the first wire, thereby dividing the light-emitting structure into two portions without increasing the complexity of the driving device layer. Under a condition that one of the two or more light-emitting function structures of the light-emitting structure has a display defect, the remaining light-emitting function structures can continue to emit light, thereby improving the display effect of the display panel, and improving the display performance of the display panel.

BRIEF DESCRIPTION OF THE DRAWINGS

Other features, purposes and advantages of the present application will become more apparent by reading the following detailed description of the non-restrictive embodiments with reference to the drawings, wherein the same or similar reference numbers indicate the same or similar features.

NOTE OF THE REFERENCE NUMBERS

Figure 1:
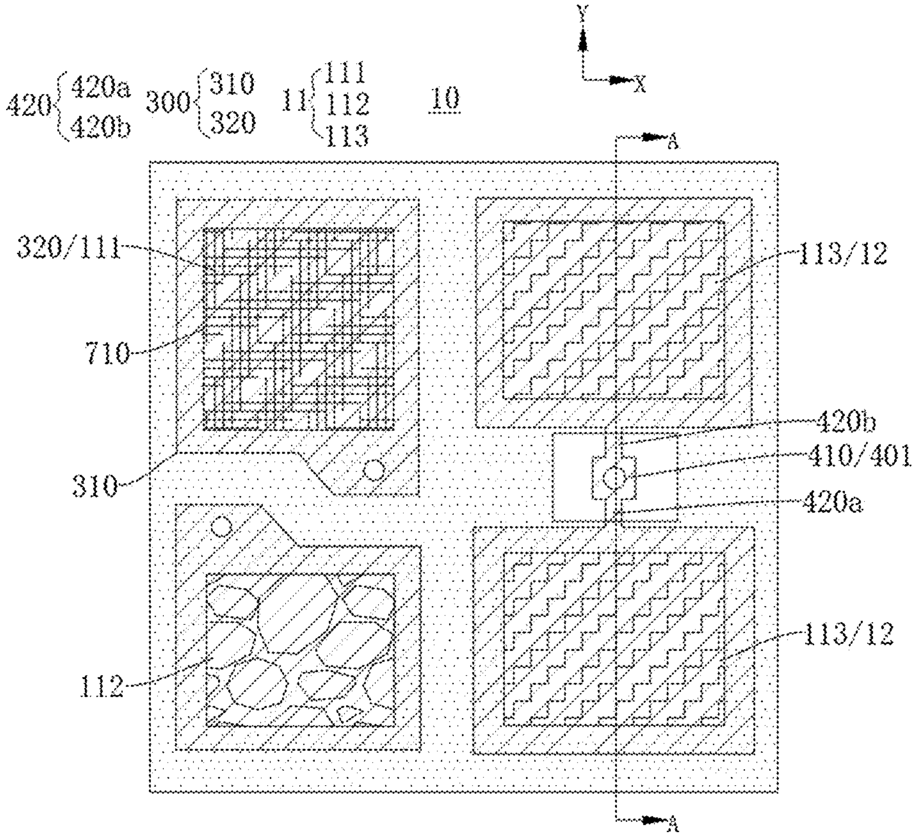
FIG. 1 is a local schematic structural diagram of a display panel provided by an embodiment of the present application.

10, display panel; 11, sub-pixel; 111, first sub-pixel; 112, second sub-pixel; 113, third sub-pixel; 12, pixel block; 13, first electrode layer;

100, substrate;

200, driving device layer; 210, driving unit; 211, thin film transistor; 211*a*, semiconductor portion; 211*b*, gate; 211*c*, interlayer insulation portion; 220, signal line;

300, light-emitting structure; 310, first electrode; 311, body portion; 312, protrusion portion; 320, light-emitting function structure;

401, first wire; 410, via portion; 420, connection line; 420*a*, first connection line; 420*b*, second connection line; 402, second wire; 403, third wire; 431, insulation gap;

500, first insulation layer; 510, first via;

600, second electrode layer; 610, through hole;

700, isolation structure; 710, first opening; 720, second opening; 730, first sub-layer; 740, second sub-layer;

800, pixel definition layer; 810, pixel definition portion; 820, pixel opening;

900, encapsulation layer;

Y, first direction; X, second direction.

DETAILED DESCRIPTION

The features and exemplary embodiments of various aspects of the present application will be described in detail below. In the detailed description below, many specific details are presented to provide a comprehensive understanding of the present application. It will be apparent to a person skilled in the art that the present application may be practiced without some of these specific details. The following description of the embodiments is merely to provide a better understanding of the present application by illustrating examples of the present application. In the drawings and the following description, at least some of the known structures and techniques are not shown in order to avoid unnecessary ambiguity in the present application; and, for clarity, the dimensions of some of the structures may be exaggerated. Furthermore, the features, structures, or characteristics described below may be combined in one or more embodiments in any suitable manner.

In the description of the present application, it should be noted that, unless otherwise stated, the "multiple" means two or more. Further, the orientations and the positional relationships indicated by the terms, such as "up", "down", "left", "right", "inside", "outside" and the like, are only used for the convenience of describing the present application and simplifying the description, rather than indicating or implying that the device or element referred to must have a specific orientation or must be constructed and operated in a specific orientation, which therefore cannot be understood as a limitation of the present application. In addition, the terms "first", "second", and the like are only used for descriptive purposes, and cannot be understood as indicating or implying relative importance.

The orientation words appearing in the following description are all directions shown in the figures, and do not limit the specific structure of the present application. In the description of the present application, it should also be noted that, unless otherwise clearly defined and limited, the terms "installed", and "connected" should be understood in a broad sense. For example, it may be a fixed connection, a detachable connection, or an integral connection; it may be a direct connection, or an indirect connection. For those of ordinary skill in the art, the specific meaning of the above-mentioned terms in the present application can be understood according to specific circumstances.

The relevant technical schemes of the arrangement of isolation structures and pixels are recited in Chinese Patent Applications No. PCT/CN2023/134518, 202310773656.6, 202310707209.0, 202311346196.5, 202310692671.8, 202310909421.5, and 202311616249.0, which are hereby incorporated by reference in their entireties.

Figure 2:
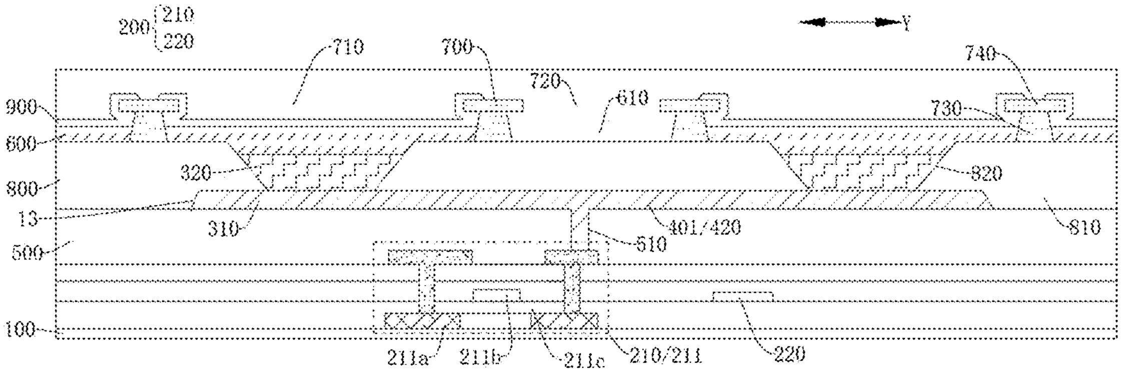
FIG. 2 is a cross-sectional view at A-A in FIG. 1.

Referring together to FIGS. 1 and 2, FIG. 1 is a local schematic structural diagram of a display panel 10 provided by an embodiment of the present application. FIG. 2 is a cross-sectional view at A-A in FIG. 1.

As shown in FIGS. 1 and 2, the embodiments of a first aspect of the present application provide a display panel 10, including: a substrate 100; a driving device layer 200 disposed on the substrate 100; a light-emitting structure 300 disposed on a side of the driving device layer 200 away from the substrate 100, wherein the light-emitting structure 300 includes two or more first electrodes 310 and light-emitting function structures 320 respectively disposed at a side of the first electrodes 310 away from the substrate 100 and spaced apart, the two or more first electrodes 310 are spaced apart and connected to each other by a first wire 401, and the first wire 401 is located between two adjacent first electrodes 310.

In the display panel 10 provided by the embodiments of the present application, the display panel 10 includes the substrate 100, the driving device layer 200 disposed on the substrate 100, and the light-emitting structure 300. The light-emitting structure 300 includes two or more first electrodes 310 and two or more light-emitting function structures 320. That is, the same light-emitting structure 300 is divided into at least two portions. The two or more first electrodes 310 of the same light-emitting structure 300 are spaced apart and connected to each other through the first wire 401, so that the two or more first electrodes 310 of the same light-emitting structure 300 can be connected to the same driving unit 210 of the driving device layer 200 through the first wire 401, thereby dividing the light-emitting structure 300 into two portions without increasing the complexity of the driving device layer 200. Under a condition that one of the two or more light-emitting function structures 320 of the light-emitting structure 300 has a display defect, the remaining light-emitting function structures 320 can continue to emit light, thereby improving the display effect of the display panel 10, and improving the display performance of the display panel 10.

Optionally, the driving device layer 200 includes a driving unit 210 used for driving the light-emitting structure 300 to emit light. Optionally, the driving unit 210 may include a plurality of thin film transistors 211 and a capacitor. The driving unit 210 may be any one of a 2T1C circuit, a 7T1C circuit, a 7T2C circuit, an 8T1C circuit, or a 9T1C circuit. In the embodiment of the present application, the "2T1C circuit" means that the driving unit 210 is a pixel circuit including two thin film transistors 211 (T) and one capacitor (C). Further, the other "7T1C circuit", "7T2C circuit", "8T1C circuit", and "9T1C circuit" are similar as the "2T1C circuit". The driving unit 210 may also include another number of thin film transistors 211 and another number of capacitors.

Optionally, the display panel 10 includes a first electrode layer 13, and a plurality of first electrodes 310 are spaced apart in the first electrode layer 13.

In some optional embodiments, the driving unit 210 and the first electrode 310 are electrically connected, such that the driving unit 210 may send a driving signal to the first electrode 310, thereby driving the light-emitting structure 300 to emit light.

Optionally, the first electrode 310 is electrically connected to the driving unit 210 by the first wire 401, so that the two or more first electrodes 310 of the same light-emitting structure 300 can be connected to the same driving unit through the first wire 401.

In some optional embodiments, the display panel includes a first insulation layer 500 located between the driving unit 210 and the first wire 401, and the first insulation layer 500 is provided with a first via 510. An orthographic projection of the first via 510 on the substrate 100 at least partially overlaps an orthographic projection of the first wire 401 on the substrate 100, and the first wire 401 is connected to the driving unit 210 through the first via 510.

In these optional embodiments, the orthographic projection of the first via 510 at least partially overlaps the orthographic projection of the first wire 401, so that when the first wire 401 is prepared, at least a part of the conductive material may fall into the first via 510, which enables the first wire 401 to be connected with the driving unit 210 through the first via 510. The same driving unit 210 may drive a plurality of first electrodes 310 through the first wire 401.

Optionally, the first insulation layer 500 may be a planarization layer.

Optionally, the orthographic projection of the first via 510 on the substrate 100 is located within an orthographic projection of the driving unit 210 on the substrate 100, so that when the first wire 401 is prepared, at least a part of the conductive material may fall onto the driving unit 210 exposed by the first via 510, which enables the first wire 401 to be connected with the driving unit 210 through the first via 510.

In some optional embodiments, the first wire 401 includes a via portion 410 and a connection line 420 that are interconnected. An orthographic projection of the via portion 410 on the substrate 100 is located within the orthographic projection of the first via 510 on the substrate 100, the connection line 420 connects the via portion 410 and the first electrode 310, and at least one connection line 420 is provided with the connection wire 420.

Optionally, the two or more first electrodes 310 include two first electrodes 310, and first wire 401 includes a via portion 410 and two connection lines 420 connecting the two first electrodes 310 with the via portion 410 respectively. So that, the two first electrodes 310 can be connected to the via portion 410 through the two connection lines 420, and can be electrically connected to the driving unit 210 through the via portion 410.

Optionally, the lengths of the two connection lines 420 are equal, so that the distances from the via portion 410 to the first electrodes 310 are equal, and the current is more balanced.

Optionally, the display panel 10 also includes a second electrode layer 600 located at a side of the light-emitting function structure 320 away from the first electrode 310.

Optionally, the first wire 401 and the first electrode 310 may be disposed in different layers.

Alternatively, in other optional embodiments, the first wire 401 and the first electrode 310 may be disposed in a same layer, so that the first electrode 310 and the first wire 401 can be fabricated in a same process step, thereby simplifying the preparation process of the display panel 10.

There may be various relative positional relationships between the first wire 401 and the first electrodes 310 connected thereto. For example, the first wire 401 and the plurality of first electrodes 310 connected thereto may be arranged side by side.

Alternatively, in other optional embodiments, at least two first electrodes 310 are spaced apart in a first direction Y, and the first wire 401 extends in the first direction Y and is connected between two adjacent first electrodes 310.

In these optional embodiments, the first wire 401 is connected between two adjacent first electrodes 310. On one hand, the extension distance of the first wire 401 may be reduced, and on the other hand, the distribution pattern of the first electrodes 310 and the first wire 401 may be simplified.

Optionally, the plurality of connection lines 420 include a first connection line **420*a* and a second connection line 420*b*, the first connection line 420*a* connects one of the two adjacent first electrodes 310 to the via portion 210, and the second connection line 420*b* connects the other of the two adjacent first electrodes 310 to the via portion 410. So that, through the first connection line 420*a* and the second connection line 420*b*, the via portion 410 can be connected to the first electrodes 310 located on two sides of the via portion 410** in the first direction Y.

Optionally, under a condition that the first wire 401 is connected between two first electrodes 310 adjacent in the first direction Y, the distances from the via portion 410 to the first electrodes 310 located on two sides of the via portion 410 in the first direction Y are equal. That is, the extension lengths of the first connection line and the second connection line are equal, and the via portion 410 is centered relative to the two first electrodes 310 adjacent in the first direction Y.

Optionally, the two first electrodes 310 may be spaced apart on two sides of the first wire 401, and the first electrodes 310 and the first wire 401 are distributed sequentially along the first direction Y. For example, an orthographic projection of the first electrode 310 on the substrate 100 is in a rectangular shape, and the two first electrodes 310 are arranged on two sides of the first wire 401 respectively.

Optionally, a shape of an orthographic projection of the light-emitting function structure 320 on the substrate 100 matches a shape of an orthographic projection of the first electrode 310 on the substrate 100. For example, when the orthographic projection of the first electrode 310 on the substrate 100 is in a rectangular shape, the shape of the orthographic projection of the light-emitting function structure 320 on the substrate 100 is also a rectangular shape, and the pitch between the edges of the orthographic projection of the light-emitting function structure 320 on the substrate 100 and the corresponding edges of the orthographic projection of the first electrode 310 on the substrate 100 is consistent.

Figure 3:
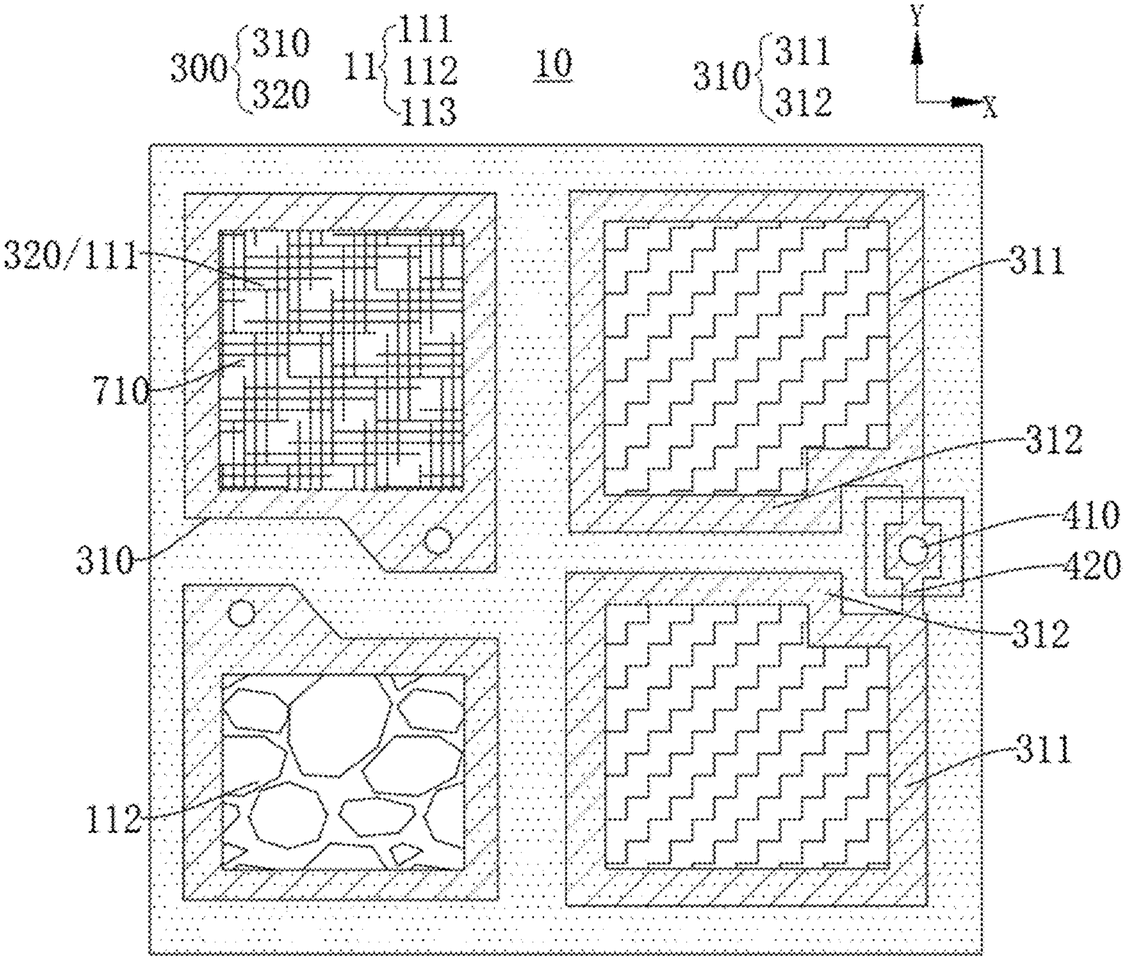
FIG. 3 is a local schematic structural diagram of a display panel provided by another embodiment of the present application.
Figure 4:
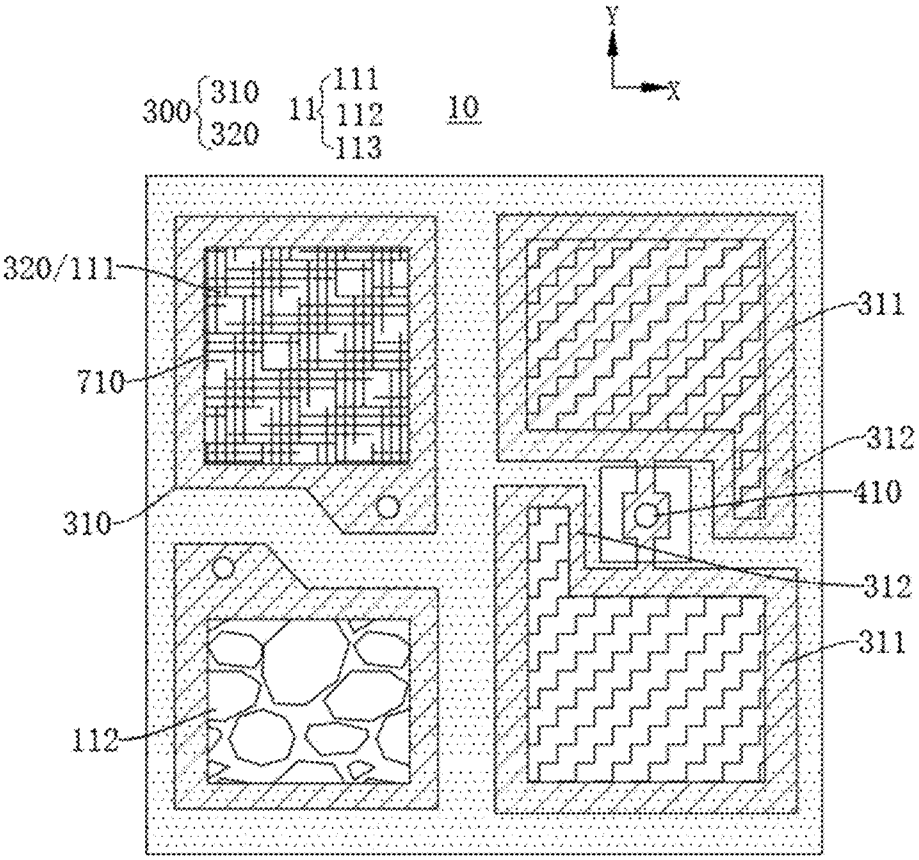
FIG. 4 is a local schematic structural diagram of a display panel provided by another embodiment of the present application.

In other optional embodiments, as shown in FIGS. 3 and 4, at least one of the first electrodes 310 connecting the first wire 401 includes a body portion 311 and a protrusion portion 312, the protrusion portion 312 protrudes from the body portion 311 toward the first wire 401, and the protrusion portion 312 and the first wire 401 are arranged side by side in a second direction X. Therefore, the distribution area of the first electrode 310 is increased, and the opening rate of the display panel 10 is increased.

Optionally, as shown in FIG. 4, the first wire 401 is connected to a middle portion of the first electrode 310 in the second direction X, the first electrodes 310 on two sides of the first wire 401 include the protrusion portion 312, and the protrusion portions 312 of the two first electrodes 310 are disposed on two sides of the first wire 401 in the second direction X respectively; or as shown in FIG. 3, the first wire 401 is connected to a side of the first electrode 310 in the second direction X. With this arrangement, the light-emitting structure 300 divided into two regions may form a large light-emitting region.

Referring to the above content, the driving unit 210 includes a thin film transistor 211. In some optional embodiments, the orthographic projection of the connection line 420 on the substrate 100 and the orthographic projection of the thin film transistor 211 on the substrate 100 are at least partially misaligned.

When it is necessary to use a laser to cut the connection line 420, because that the orthographic projection of the connection line 420 on the substrate 100 and the orthographic projection of the thin film transistor 211 on the substrate 100 are at least partially misaligned, the influence on the characteristics of the thin film transistor 211 can be improved.

Optionally, the thin film transistor 211 includes a semiconductor portion 211*a*, a gate 211*b*, and an interlayer insulation portion 211*c* located between the semiconductor portion 211*a* and the gate 211*b*, and the orthographic projection of the connection line 420 on the substrate 100 is located outside of orthographic projections of the semiconductor portion 211*a*, the gate 211*b*, and the interlayer insulation portion 211*c* on the substrate 100, thereby further reducing the influence of the laser on the characteristics of the thin film transistor 211.

Optionally, the driving device layer 200 includes a signal line 220, and the orthographic projection of the connection line 420 on the substrate 100 is located outside of an orthographic projection of the signal line 220 on the substrate 100, thereby improving the influence of the laser on the signal line 220.

Referring to the above content, the display panel 10 further includes a second electrode layer 600 located at a side of the light-emitting function structure 320 away from the substrate 100, wherein the second electrode layer 600 includes a through hole 610, and an orthographic projection of the connection line 420 on the substrate 100 is located within an orthographic projection of the through hole 610 on the substrate 100.

In these optional embodiments, by disposing the through hole 610 in the second electrode layer 600, the laser light can penetrate through the second electrode layer 600 to cut the connection line 420.

In some optional embodiments, the display panel further includes a plurality of first light-emitting structures, a plurality of second light-emitting structures and a plurality of third light-emitting structures emitting light of different colors, and at least one of the plurality of first light-emitting structures, the plurality of second light-emitting structures and the plurality of third light-emitting structures includes the light-emitting structure 300. Optionally, the first light-emitting structure may be a red light-emitting structure, the second light-emitting structure may be a green light-emitting structure, and the third light-emitting structure may be a blue light-emitting structure. For example, the embodiment of the present application illustrates the third light-emitting structure as the above light-emitting structure 300.

In some optional embodiments, the display panel includes sub-pixels 11, and the sub-pixel 11 may be formed by combining the above first electrode 310, the light-emitting function structure 320, and a part of the second electrode layer 600. Optionally, the sub-pixels 11 include a first sub-pixel 111, a second sub-pixel 112 and a third sub-pixel 113 spaced apart and of different colors, and the first sub-pixel 111, the second sub-pixel 112 and the third sub-pixel 113 are disposed adjacent to each other, thereby reducing the distance between different sub-pixels 11.

Optionally, at least one of the first sub-pixel 111, second sub-pixel 112, and third sub-pixel 113 include the light-emitting structure 300. For example, the first sub-pixel 111 may include a first light-emitting structure, the second sub-pixel may include a second light-emitting structure, and the third sub-pixel may include a third light-emitting structure.

Optionally, the second sub-pixel 112 is located on a side of the first sub-pixel 111 in the first direction Y, the third sub-pixel 113 is located on a side of the first sub-pixel 111 in the second direction X, and the first direction Y and the second direction X intersect, thereby further reducing the spacing between the different sub-pixels.

Optionally, in the first direction Y, the lengths of the first sub-pixel 111 and the second sub-pixel 112 are consistent, and the two side edges of the first sub-pixel 111 and the second sub-pixel 112 are respectively equally aligned to form a rectangular structure, thereby making the arrangement of the sub-pixels 11 more regular.

Optionally, in the first direction Y and/or in the second direction X, the lengths of the first sub-pixel 111, the second sub-pixel 112, and the third sub-pixel 113 are consistent, thereby making the arrangement of the sub-pixels 11 more regular.

Optionally, in the second direction X, one side edge of the first sub-pixel 111 is equally aligned with one side edge of the third sub-pixel 113, thereby making the arrangement of the sub-pixels 11 more regular.

Optionally, in the second direction X, one side edge of the second sub-pixel 112 is equally aligned with one side edge of the third sub-pixel 113, thereby making the arrangement of the sub-pixels 11 more regular.

Optionally, the first sub-pixel 111, the second sub-pixel 112 and the third sub-pixel 113 are in a long strip shape, and are spaced apart in sequence in the first direction Y or the second direction X, thereby making the arrangement of the sub-pixels 11 more regular.

Optionally, in the second direction X that intersects the first direction Y, the lengths of the first sub-pixel 111, the second sub-pixel 112 and the third sub-pixel 113 are consistent, and the two side edges of the first sub-pixel 111, the second sub-pixel 112 and the third sub-pixel 113 are respectively equally aligned to form a rectangular structure, thereby making the arrangement of the sub-pixels 11 more regular.

In some optional embodiments, the light-emitting structure 300 defines a first region and a second region independent of each other, and the two or more first electrodes 310 and the light-emitting function structures 320 are located in the first region and the second region respectively. As shown in FIGS. 1 to 4, the display panel 10 further includes an isolation structure 700 disposed on a side of the driving device layer 200 away from the substrate 100, the isolation structure 700 defines a plurality of first openings 710, and the light-emitting function structures 320 are isolated by the isolation structure 700 and located within the first openings 710 respectively.

In these optional embodiments, by setting the isolation structure 700, the light-emitting structure 300 can be divided into a plurality of light-emitting function structures 320 that are separately disposed from each other, thereby improving the interaction of two adjacent light-emitting function structures 320.

Optionally, the material of the first sub-layer 730 includes a conductive material. The display panel 10 further includes a second electrode layer 600, and the second electrode layer 600 includes second electrodes located on a side of the light-emitting function structures 320 away from the substrate 100. The second electrodes are electrically connected to the first sub-layer 730, such that the plurality of second electrodes can be interconnected as a surface electrode through the first sub-layer 730.

Optionally, the material of the second sub-layer 740 includes a conductive material. Optionally, the material of the third sub-layer includes a conductive material. Optionally, the materials of the second sub-layer 740 and the third sub-layer are the same.

Optionally, the first region and the second region are light-emitting regions, and the light-emitting function structures 320 are located within the light-emitting regions, thereby achieving light-emitting display of the display panel.

Optionally, in other embodiments, the isolation structure 700 may not be provided with the second opening 720. Under a condition that both the first region and the second region are light-emitting regions, when the encapsulation fails or the light-emitting function structure contains water vapor, the first region does not emit light, and the second region can still emit light in this state. Therefore, the overall light-emitting is not affected, and there is no need to break the first wire 401.

The isolation structure 700 may be arranged in various ways. For example, the isolation structure 700 includes a first sub-layer 730 and a second sub-layer 740 located on a side of the first sub-layer 730 away from the substrate 100, and an orthographic projection of the first sub-layer 730 on the substrate 100 is located within an orthographic projection of the second sub-layer 740 on the substrate 100. That is, the size of the orthographic projection of the first sub-layer 730 on the substrate 100 is smaller than the size of the orthographic projection of the second sub-layer 740 on the substrate 100. Therefore, a concave is formed under the second sub-layer 740. In the preparation process of the light-emitting function structures 320, the light-emitting material can be separated by the isolation structure 700 into light-emitting functional structures 320 independent of each other, and the precision mask plate evaporation process can be omitted.

Optionally, the isolation structure 700 further includes a third sub-layer located on a side of the first sub-layer 730 facing the substrate 100, and the orthographic projection of the first sub-layer 730 on the substrate 100 is located within an orthographic projection of the third sub-layer on the substrate 100. In the preparation process of the isolation structure 700, when the size of the first sub-layer 730 is reduced by lateral etching, the third sub-layer can provide protection to the bottom layer structure, thereby improving the influence of the lateral etching on other membrane layers.

In some optional embodiments, the isolation structure 700 between the first region and the second region is provided with a second opening 720, and an orthographic projection of the first wire 401 on the substrate 100 at least partially overlaps an orthographic projection of the second opening 720 on the substrate 100. Therefore, the laser light can pass through the second opening 720 to reach the first wire 401 and cut the first wire 401 into two portions insulated from each other. The size of the second opening 720 is smaller than the size of the first opening 710.

Optionally, the orthographic projection of the through hole 610 of the second electrode layer 600 on the substrate 100 at least partially overlaps the orthographic projection of the second opening 720 on the substrate 100, so that the laser light can simultaneously pass through the through hole 610 and the second opening 720.

Optionally, referring to the above content, the driving device layer includes a driving unit. The first wire 401 includes a via portion 410 and a connection line 420 connecting the via portion 410 and the first electrode 310. The via portion 410 and the driving unit 210 are connected through a via connection. An orthographic projection of the connection line 420 on the substrate 100 at least partially overlaps the orthographic projection of the second opening 720 on the substrate 100, so that the laser light can pass through the second opening 720 to reach the connection line 420, and cut the connection line 420 into two portions insulated from each other within the connection line 420.

Optionally, the display panel 10 further includes a pixel definition layer 800 located between the isolation structure 700 and the driving device layer 200, the pixel definition layer 800 includes a pixel definition portion 810 and a pixel opening 820 disposed at the pixel definition portion 810, the pixel opening 820 and the first opening 710 are connected, and the pixel definition portion 810 covers the first wire 401.

In these optional embodiments, the light-emitting function structure 320 may be disposed in the pixel opening 820, and the pixel definition portion 810 covers the first wire 401. When the isolation structure 700 is prepared subsequently, the pixel definition portion 810 may provide protection to the first wire 401, thereby improving the problem that the first wire 401 is easily broken when being affected.

Optionally, the material of the pixel definition layer 800 includes a light transmittance material, such that the laser light can penetrate through the pixel definition layer 800 to cut the first wire 401.

Optionally, the isolation structure 700 may be disposed on a side of the pixel definition portion 810 away from the substrate 100.

In some optional embodiments, the first electrode 310, the light-emitting function structure 320, and a part of the second electrode layer 600 located on the light-emitting function structure 320 constitute a sub-pixel 11. Then, at least one of the sub-pixels 11 includes two or more pixel blocks 12, two adjacent pixel blocks 12 are spaced apart by the isolation structure 700, each of the pixel blocks 12 includes a first electrode 310 and a light-emitting function structure 320 located on a side of the first electrode 310 away from the substrate 100, and at least two first electrodes 310 are connected with each other through the first wire 401.

In these optional embodiments, a same sub-pixel 11 includes two or more pixel blocks 12, and the first electrodes 310 of the two or more pixel blocks 12 are connected with each other through the first wire 401. Under a condition that one of the plurality of pixel blocks 12 of the sub-pixel 11 has abnormal display, the first wire 401 can be disconnected, so that the pixel block 12 having the abnormal display is disconnected, and the other pixel blocks 12 may display normally, thereby improving the display effect of the display panel 10.

In some optional embodiments, the plurality of sub-pixels 11 includes a first sub-pixel 111, a second sub-pixel 112 and a third sub-pixel 113. The first sub-pixel 111 and the second sub-pixel 112 are arranged side by side in the first direction Y. The third sub-pixel 113 and the first sub-pixel 111 are arranged side by side in the second direction X, and the third sub-pixel 113 and the second sub-pixel 112 are arranged side by side in the second direction X. At least one of the first sub-pixel 111, the second sub-pixel 112 and the third sub-pixel 113 includes two pixel blocks 12.

For example, the first sub-pixel 111 may be a red sub-pixel, the second sub-pixel 112 may be a green sub-pixel, and the third sub-pixel 113 may be a blue sub-pixel. At least one of the red sub-pixel, the green sub-pixel, and the blue sub-pixel may include two aforementioned pixel blocks 12.

Optionally, the distribution area of the single third sub-pixel 113 is larger than the distribution area of the first sub-pixel 111 and the second sub-pixel 112, and the third sub-pixel 113 may include two or more pixel blocks 12 arranged side by side in the first direction Y. For example, the third sub-pixel 113 may include two pixel blocks 12, wherein one pixel block 12 and the first sub-pixel 111 are arranged side by side in the second direction X, and the other pixel block 12 and the second sub-pixel 112 are arranged side by side in the second direction X. Therefore, the arrangement of multiple sub-pixels 11 is more simple and regular.

Figure 5:
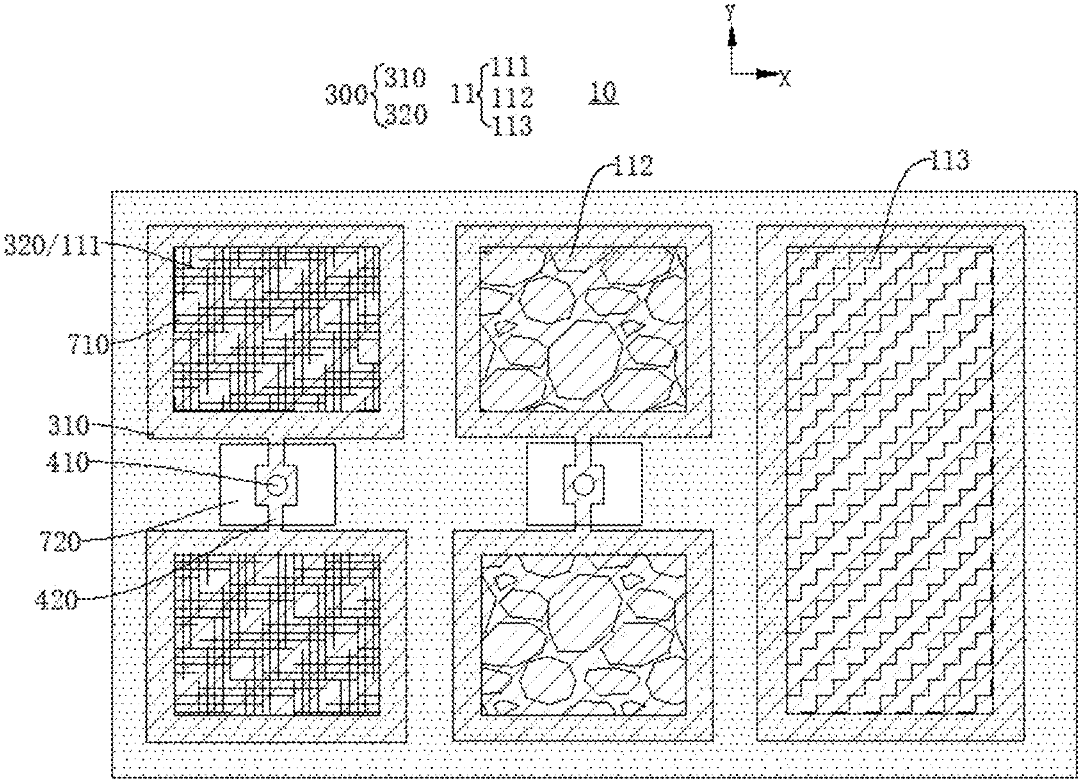
FIG. 5 is a local schematic structural diagram of a display panel provided by another embodiment of the present application.

In other optional embodiments, as shown in FIG. 5, a single first sub-pixel 111 may include two adjacent pixel blocks 12, and/or, a single second sub-pixel 112 may include two adjacent pixel blocks 12, and the third sub-pixel 113 may be integrally disposed. Optionally, the two pixel blocks 12 of the first sub-pixel 111 may be arranged side by side in the first direction Y or the second direction X. Optionally, the two pixel blocks 12 of the second sub-pixel 112 may be arranged side by side in the first direction Y or the second direction X.

Figure 6:
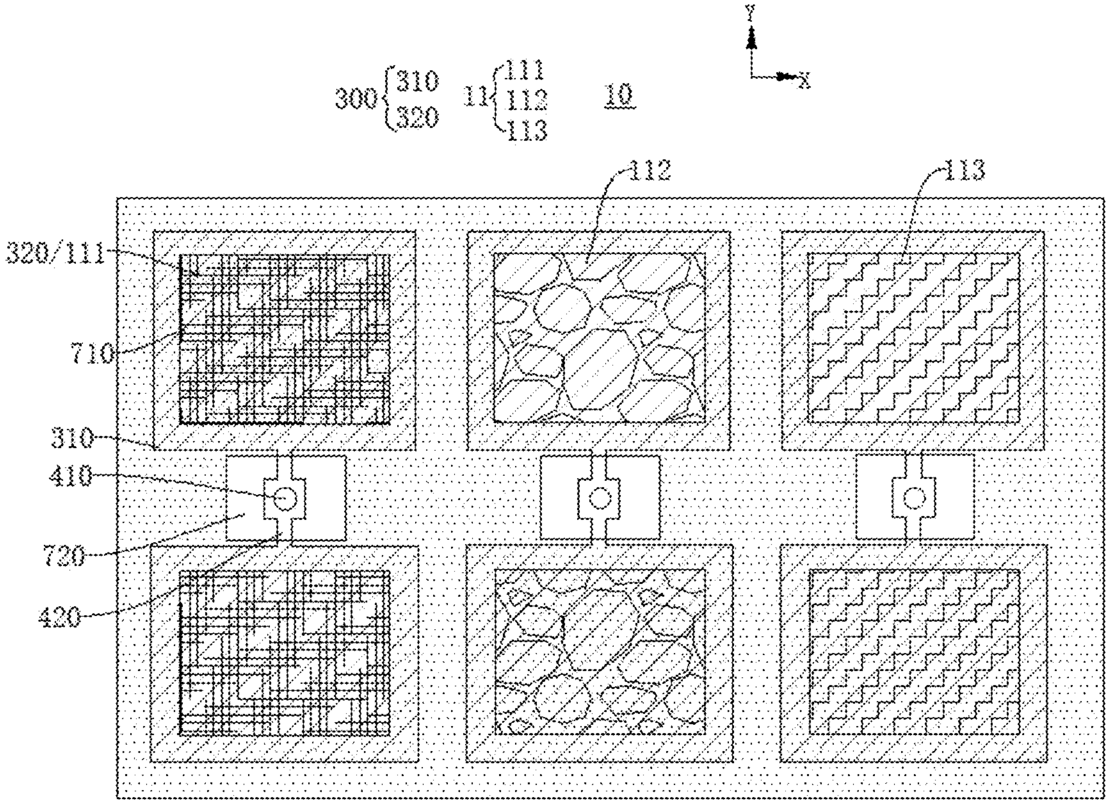
FIG. 6 is a local schematic structural diagram of a display panel provided in another embodiment of the present application.

In some optional embodiments, as shown in FIG. 6, the single first sub-pixel 111, the single second sub-pixel 112, and the single third sub-pixel 113 all include two adjacent pixel blocks 12.

As shown in FIGS. 1 to 6, the embodiments of the first aspect of the present application further provide a display panel 10, including: a substrate 100; a driving device layer 200 disposed on the substrate 100; a light-emitting structure 300 disposed on a side of the driving device layer 200 away from the substrate 100 and defining a first region and a second region independent of each other, wherein the light-emitting structure 300 includes two or more first electrodes 310 and light-emitting function structures 320 respectively disposed at a side of the first electrodes 310 away from the substrate 100 and spaced apart, the two or more first electrodes 310 and the light-emitting function structures 320 are located in the first region and the second region respectively, the two or more first electrodes 310 are spaced apart and connected to each other by a first wire 401, and the first wire 401 is located between two adjacent first electrodes 310; an isolation structure 700 disposed on the side of the driving device layer 200 away from the substrate 100, wherein the isolation structure 700 defines a plurality of first openings 710, and the light-emitting function structures 320 are isolated by the isolation structure 700 and located in the first openings 710 respectively.

In these optional embodiments, the two or more first electrodes 310 of the same light-emitting structure 300 are spaced apart and connected to each other through the first wire 401, so that the two or more first electrodes 310 of the same light-emitting structure 300 can be connected to the same driving unit 210 of the driving device layer 200 through the first wire 401, thereby dividing the light-emitting structure 300 into two portions without increasing the complexity of the driving device layer 200. The isolation structure 700 may isolate the two light-emitting function structures 320 of the light-emitting structure 300, thereby improving the interaction of the two adjacent light-emitting function structures 320. Under a condition that one of the two or more light-emitting function structures 320 of the light-emitting structure 300 has a display defect, the remaining light-emitting function structures 320 can continue to emit light, thereby improving the display effect of the display panel 10, and improving the display performance of the display panel 10.

Optionally, the arrangements of the isolation structure 700, the driving device layer 200, and the first wire 401 may be as above, which will not be repeated here. Optionally, the display panel 10 may further include a pixel definition layer 800, and the arrangement of the pixel definition layer 800 may be as above, which will not be repeated here.

As shown in FIGS. 1 to 8, the embodiments of the first aspect of the present application further provide a display panel 10 including a substrate 100, a plurality of sub-pixels 11 disposed on the substrate 100, and an isolation structure 700, wherein at least one of the sub-pixels 11 includes two or more pixel blocks 12, two adjacent pixel blocks 12 are spaced apart by the isolation structure 700, each of the pixel blocks 12 includes a first electrode 310 and a light-emitting function structure 320 located on a side of the first electrode 310 away from the substrate 100, and at least two first electrodes 310 are connected with each other through a first wire 401.

In the embodiments of the present application, a same sub-pixel 11 includes two or more pixel blocks 12, and the first electrodes 310 of the two or more pixel blocks 12 are connected with each other through the first wire 401. Under a condition that one of the plurality of pixel blocks 12 of the sub-pixel 11 has abnormal display, the first wire 401 can be disconnected, so that the pixel block 12 having the abnormal display is disconnected, and the other pixel blocks 12 may display normally, thereby improving the display effect of the display panel 10.

Optionally, the display panel 10 may also include a driving device layer 200 and a pixel definition layer 800, and the arrangements of the sub-pixels 11, the isolation structure 700, the driving device layer 200 and the pixel definition layer 800 may be as above, which will not be repeated here.

Figure 7:
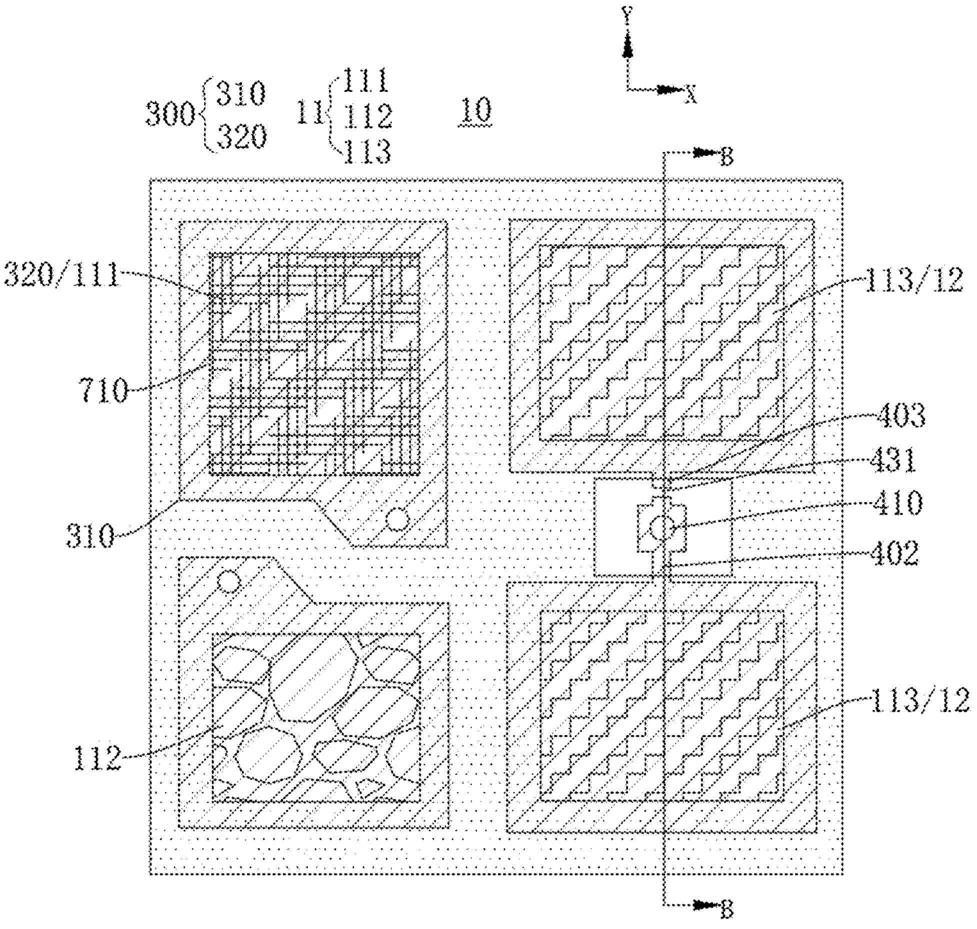
FIG. 7 is a local schematic structural diagram of a display panel provided by another embodiment of the present application.
Figure 8:
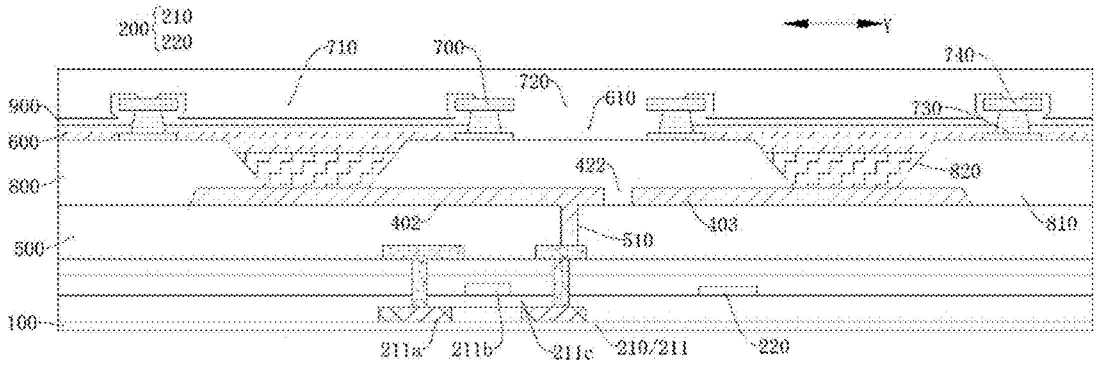
FIG. 8 is a cross-sectional view at B-B in FIG. 7.
Figure 9:
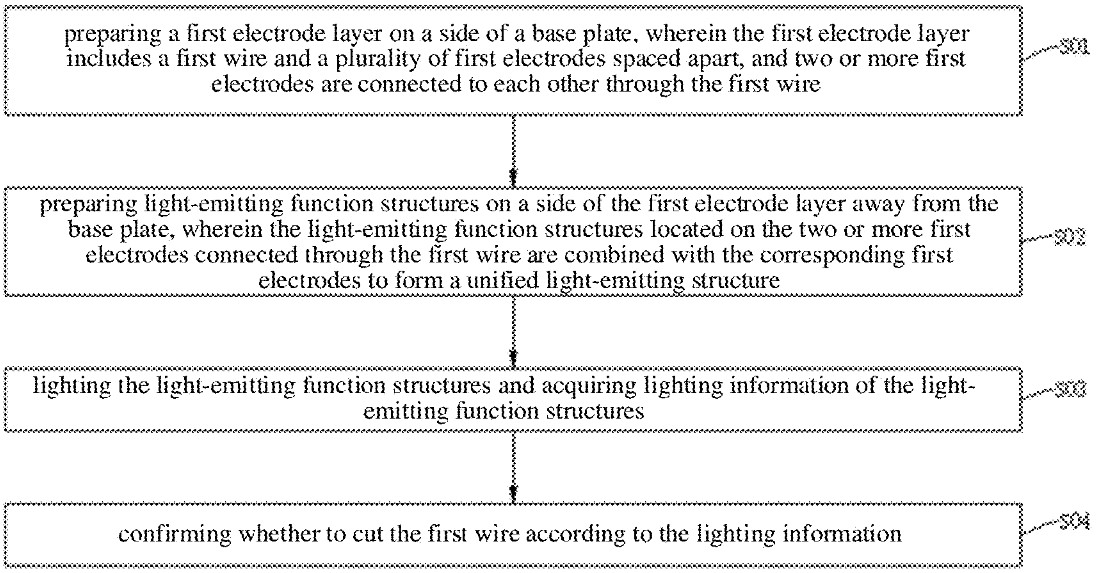
FIG. 9 is a schematic flow chart of a method for repairing a display panel provided by an embodiment of the present application.

As shown in FIGS. 7 and 8, the embodiments of the first aspect of the present application further provide a display panel 10, including: a substrate 100; a driving device layer 200 disposed on the substrate 100 and including a driving unit 210; a light-emitting structure 300 disposed on a side of the driving device layer 200 away from the substrate 100 and defining a first region and a second region independent of each other, wherein the light-emitting structure 300 includes first electrodes 310 located in the first region and the second region as well as light-emitting function structures 320 respectively disposed at a side of the first electrodes away from the substrate 100 and spaced apart, the first electrode 310 located in the first region is electrically connected to the driving unit 210 through a second wire 402, and the first electrode 310 located in the second region is disposed independently and is not connected to the driving unit 210.

In these optional embodiments, the first electrode 310 in the second region is disposed independently and is not connected to the driving unit 210, so that the first electrode 310 in the first region does not affect the normal operation of the first electrode 310 in the second region, thereby improving the display effect of the display panel.

In some optional embodiments, the display panel includes a third wire 403, and the third wire 403 is provided with an insulation gap 431. Through the insulation gap 431, the third wire 403 is divided into two portions that are spaced apart and insulated from each other, so that the first electrode 310 connected to the third wire 403 is not connected to the driving unit 210.

Optionally, the second wire 402 includes the above via portion 410 and the connection line 420, the via portion 410 and the driving unit 210 are connected through via connection, and the connection line 420 connects the via portion 410 and the first electrode 310. Optionally, the third wire 403 is disconnected from the via portion 410.

Optionally, as described above, the display panel further includes the isolation structure 700, and the isolation structure 700 defines a plurality of first openings 710 and a second opening 720. The light-emitting function structures 320 are isolated by the isolation structure 700 and located within the first openings 710 respectively, and an orthographic projection of the insulation gap 431 on the substrate 100 is located within an orthographic projection of the second opening 720 on the substrate 100, so that the laser can cut the third wire 403 by penetrating through the second opening 720 of the isolation structure 700.

Optionally, as described above, under a condition that the display panel includes a thin film transistor 211, the orthographic projection of the insulation gap 431 on the substrate 100 and an orthographic projection of the thin film transistor 211 on the substrate 100 are at least partially misaligned, thereby improving the influence on the thin film transistor 211 during laser cutting of the third wire 403.

Optionally, the orthographic projection of the insulation gap on the substrate 100 is located outside of orthographic projections of the semiconductor portion 211*a*, the gate 211*b*, and the interlayer insulation portion 211*c* on the substrate 100, thereby improving the influence on the thin film transistor 211 during laser cutting of the third wire 403.

Optionally, the orthographic projection of the insulation gap 431 on the substrate 100 is located outside of an orthographic projection of the signal line on the substrate 100, thereby improving the influence on the signal line during laser cutting of the third wire 403.

Optionally, the difference between this embodiment of the present application and any of the above display panels 10 is that the arrangements of the second wire 402 and the third wire 403 are different from the arrangement of the above first wire 401. Other arrangements may be referred to the above description, which will not be repeated here.

In at least one embodiment of the present disclosure, the isolation structure 700 extends in the first direction and the second direction, and the sub-pixels 11 are isolated by the isolation structure 700 to form adjacent pixel blocks 12 in the first direction and/or adjacent pixel blocks 12 in the second direction. By setting the isolation structure 700 and forming the first openings 710 corresponding to the pixel blocks 12, when the pixel blocks 12 is prepared, the light-emitting function structures 320 of the pixel blocks 12 can be isolated by the isolation structure 700 and can be deposited into the first openings 710, thereby forming the pixel blocks 12 isolated in the first direction and the second direction. The isolation structure 700 is arranged in this way, so that the isolation effect between the pixel blocks 12 is good, and the mutual influence between the pixel blocks 12 is reduced. Under a condition that one of the pixel blocks 12 has a dark spot problem, the other pixel blocks 12 continue to emit light normally, thereby ensuring the normal light-emitting of the display panel. That is, the sub-pixels 11 are divided by the isolation structure 700 into a plurality of pixel blocks 12, which can improve the influence of a single dark spot on the display effect of the display panel.

The embodiments of a second aspect of the present application further provide a display device including the display panel 10 described in any of the above embodiments in the first aspect. Since the display device provided by the embodiments of the second aspect of the present application includes the display panel 10 described in any of the above embodiments in the first aspect, the display device provided by the embodiments of the second aspect of the present application has the beneficial effects of the display panel 10 described in any of the above embodiments in the first aspect, which will not be repeated here.

The display device in the embodiments of the present application includes, but is not limited to, a mobile phone, a personal digital assistant (PDA), a tablet computer, an e-book, a TV set, an entrance guard, a smart landline telephone, a console and other devices with the display function.

A third aspect of the present application further provides a method for repairing a display panel 10. The display panel 10 may be the display panel 10 described in any of the above embodiments in the first aspect, as shown in FIGS. 1 to 9. The method for repairing the display panel 10 includes steps S01 to S04

Step S01: preparing a first electrode layer 13 on a side of a base plate, wherein the first electrode layer 13 includes a first wire 401 and a plurality of first electrodes 310 spaced apart, and two or more first electrodes 310 are connected to each other through the first wire 401.

Optionally, the base plate may include a substrate 100 and a driving device layer 200 disposed on the substrate 100. The driving device layer 200 may include a driving unit 210. Optionally, the base plate may also include a first insulation layer 500 located on a side of the driving device layer 200 away from the substrate 100, and the first insulation layer 500 includes a first via 510. When the first electrode layer 13 is prepared in step S01, at least a part of the conductive material may fall into the first via 510, so that the first wire 401 and the driving unit 210 are electrically connected to each other.

Step S02: preparing light-emitting function structures 320 on a side of the first electrode layer 13 away from the base plate, wherein the light-emitting function structures 320 located on the two or more first electrodes 310 connected through the first wire 401 are combined with the corresponding first electrodes 310 to form a unified light-emitting structure 300.

Optionally, after step S02, a membrane layer structure such as a second electrode layer 600 and an encapsulation layer 900 may be prepared on the light-emitting function structures 320.

Step S03: lighting the light-emitting function structures and acquiring lighting information of the light-emitting function structures 320.

Step S04: confirming whether to cut the first wire according to the lighting information.

In the method provided by the embodiment of the present application, firstly, when preparing the first electrode layer 13, the first wire 401 is connected to two or more first electrodes 310, and the two or more first electrodes 310 connected to the first wire 401 and the light-emitting function structures 320 located on the two or more first electrodes 310 constitute a same light-emitting structure 300. In step S03, the brightness information of two or more light-emitting function structures 320 of the same light-emitting structure 300 may be acquired. The first wire 401 may be cut according to the brightness information, thereby improving the influence of the light-emitting function structure 320 with abnormal brightness on the other light-emitting function structures 320. Therefore, the method for repairing the display panel 10 provided by the embodiments of the third aspect of the present application may repair the display abnormal of the display panel 10.

The inventor finds that during the preparation of the display panel 10, metal particles may be produced, which may fall between the first electrode 310 and the second electrode layer 600, thereby causing a short circuit connection between the first electrode 310 and the second electrode layer 600, and thus causing a brightness problem of the light-emitting structure 300.

In the embodiment of the present application, when the light-emitting structure 300 has a brightness problem, by setting the first wire 401, during the preparation of the display panel, the first wire 401 may be cut. Therefore, the first electrode 310 corresponding to the light-emitting function structure 320 having the brightness problem in the light-emitting structure may be disconnected from the via portion 410, thereby improving the short circuit connection of the first electrode 310 and the second electrode layer 600, causing the other light-emitting function structures 320 to continue emitting light normally, and improving the display problem of the display panel 10.

As described above, the base plate includes a driving device layer 200, the driving device layer 200 includes a driving unit 210, the first wire 401 includes the via portion 410, and the first wire 401 is electrically connected to the driving unit 210 through the via portion 410. Then, in step S04, under a condition that there is a light-emitting function structure 320 with abnormal brightness, the first wire 401 is cut between the first electrode 310 corresponding to the light-emitting function structure 320 with abnormal brightness and the via portion 410. Therefore, the influence of the light-emitting function structure 320 with abnormal brightness on the display of other light-emitting function structures 320 may be improved.

Optionally, as described above, under a condition that the first wire 401 includes a connection line 420, in step S04, the connection line 420 may be cut to form an insulation gap 431 at the connection line 420. The cut first wire 401 becomes a second wire 402 and a third wire 403, wherein the second wire 402 connects the via portion 410 and the first electrode 310, and the third wire 403 has the insulation gap 431.

Optionally, under a condition that there is no light-emitting function structure 320 with abnormal brightness, the first wire 401 is not cut.

Optionally, in step S04, under a condition that there is a brightness difference among the light-emitting function structures 320 corresponding to the two or more first electrodes 310 connected through the first wire 401, a light-emitting function structure 320 with a lowest brightness is confirmed as the light-emitting function structure 320 with abnormal brightness.

As described above, under a condition that there is a short circuit connection of the first electrode 310 and the second electrode layer 600 due to the presence of metal particles between the first electrode 310 and the second electrode layer 600, the light-emitting function structure 320 between the first electrode 310 and the second electrode layer 600 in the short circuit connection is not lighted. However, due to the small size and the high resistance of the first wire 401, the light-emitting function structures 320 between the second electrode layer 600 and the other first electrodes 310 connected to the first wire 401 are affected and the brightness is reduced. In the embodiment of the present application, the light-emitting function structure 320 with the lowest brightness is confirmed as the light-emitting function structure 320 with abnormal brightness, the first wire 401 is cut between the first electrode 310 corresponding to the light-emitting function structure 320 with abnormal brightness and the via portion 410, and the first electrode 310 corresponding to the light-emitting function structure 320 with abnormal brightness is disconnected from and the other first electrodes 310, thereby improving the influence of the light-emitting function structure 320 with abnormal brightness on the other light-emitting function structures 320.

In other optional embodiments, before step S04, the method further includes acquiring pattern information when the display panel 10 is not lighted, and confirming position information of an impurity according to the pattern information. In step S04, based on the position information and the lighting information, a light-emitting function structure 320 that is not lighted and where the impurity is located may be confirmed as the light-emitting function structure 320 with abnormal brightness.

In the embodiment of the present application, the position information of the impurity, namely the position information of the metal particles, can be directly acquired. Under a condition that light-emitting structure 300 with abnormal display is found, it is further possible to determine which light-emitting function structure 300 in the light-emitting structure 300 with abnormal display has the impurity in its region, and to confirm the light-emitting function structure 320 that is not lighted and where the impurity is located as the light-emitting function structure 320 with abnormal brightness, thereby accurately finding the light-emitting function structure 320 with abnormal brightness.

Although the present application has been described with reference to the preferred embodiments, without departing from the scope of the present application, various improvements may be made and components may be replaced with equivalents. In particular, the various technical features mentioned in the respective embodiment can be combined in arbitrary ways as long as there is no structural conflict. The present application is not limited to the specific embodiments disclosed herein, but includes all technical schemes falling within the scope of the claims.

What is claimed is:

1. A display panel, comprising:

a substrate;

a driving device layer disposed on the substrate;

a light-emitting structure disposed on a side of the driving device layer away from the substrate, wherein the light-emitting structure comprises two or more first electrodes and light-emitting function structures respectively disposed at a side of the first electrodes away from the substrate and spaced apart, the two or more first electrodes are spaced apart and connected to each other by a first wire, and the first wire is located between two adjacent first electrodes, a pixel definition portion disposed on the side of the driving device layer away from the substrate; and an isolation structure stacked on the pixel definition portion, the isolation structure separates and isolates second electrodes, wherein an orthographic projection of the isolation structure on the substrate is located within an orthographic projection of a pixel defining portion on the substrate.

2. The display panel according to claim 1, wherein the driving device layer comprises a driving unit electrically connected to the first electrode, the first electrode is electrically connected to the driving unit through the first wire;

the display panel comprises a first insulation layer located between the driving unit and the first wire, and the first insulation layer is provided with a first via;

the first wire comprises a via portion and two connection lines connecting the two first electrodes with the via portion respectively, an orthographic projection of the via portion on the substrate is located within an orthographic projection of the first via on the substrate, and the via portion is connected to the driving unit through the first via;

the orthographic projection of the first via on the substrate is located within the orthographic projection of the driving unit on the substrate;

lengths of the two connection lines are equal, the display panel further comprises a second electrode layer located at a side of the light-emitting function structure away from the substrate, wherein the second electrode layer comprises a through hole, and an orthographic projection of the connection lines on the substrate is located within an orthographic projection of the through hole on the substrate.

3. A display panel, comprising:

a substrate;

a driving device layer disposed on the substrate;

a light-emitting structure disposed on a side of the driving device layer away from the substrate and defining a first region and a second region independent of each other, wherein the light-emitting structure comprises two or more first electrodes and light-emitting function structures respectively disposed at a side of the first electrodes away from the substrate and spaced apart, the two or more first electrodes and the light-emitting function structures are located in the first region and the second region respectively, the two or more first electrodes are spaced apart and connected to each other by a first wire, and the first wire is located between two adjacent first electrodes;

a pixel definition portion disposed on the side of the driving device layer away from the substrate;

an isolation structure stacked on the pixel definition portion, wherein the isolation structure defines a plurality of first openings, and the light-emitting function structures are isolated by a pixel defining portion, the isolation structure separates and isolates second electrodes, wherein an orthographic projection of the isolation structure on the substrate is located within an orthographic projection of the pixel defining portion on the substrate.

4. The display panel according to claim 3, wherein the first region and the second region are light-emitting regions, the isolation structure between the first region and the second region is provided with a second opening, and an orthographic projection of the first wire on the substrate at least partially overlaps an orthographic projection of the second opening on the substrate, the driving device layer comprises a driving unit;

the first wire comprises a via portion and a connection line connecting the via portion and the two or more first electrodes, wherein an orthographic projection of the connection line on the substrate at least partially overlaps the orthographic projection of the second opening on the substrate;

wherein the display panel further comprises a pixel definition layer located between the isolation structure and the driving device layer, the pixel definition layer comprises the pixel definition portion and a pixel opening defined by the pixel definition portion, the pixel opening is communicated with the first opening, and the pixel definition portion covers the first wire;

a material of the pixel definition layer comprises a light transmissive material.

5. A display panel, comprising: a substrate, a plurality of sub-pixels disposed on the substrate, and an isolation structure, wherein at least one of the sub-pixels comprises two or more pixel blocks, two adjacent pixel blocks are spaced apart by the isolation structure, each of the pixel blocks comprises a first electrode and a light-emitting function structure located on a side of the first electrode away from the substrate, and at least two of the first electrodes are connected with each other through a first wire, the isolation structure separates and isolates second electrodes, wherein the display panel further comprises a pixel definition portion stacked below the isolation structure, and an orthographic projection of the isolation structure on the substrate is located within an orthographic projection of a pixel defining portion on the substrate.

6. The display panel according to claim 5, wherein the display panel further comprises a driving device layer located between the substrate and the isolation structure, and the driving device layer comprises a driving unit;

the first wire comprises a via portion and a plurality of connection lines connecting the via portion and the first electrodes, and the via portion and the driving unit are connected through via and metallization connection;

the isolation structure is disposed on a side of the driving unit away from the substrate, the isolation structure encloses a first opening and a second opening, and an orthographic projection of the connection line on the substrate at least partially overlaps an orthographic projection of the second opening on the substrate;

the display panel further comprises a pixel definition layer located on a side of the isolation structure facing the driving unit, the pixel definition layer comprises the pixel definition portion and a pixel opening disposed at the pixel definition portion, the pixel opening and the first opening are connected, the light-emitting function structure is located within the pixel opening, and the pixel definition portion covers the connection line, and wherein the plurality of sub-pixels comprises a first sub-pixel, a second sub-pixel, and a third sub-pixel, the first sub-pixel and the second sub-pixel are arranged side by side in a first direction, the third sub-pixel and the first sub-pixel are arranged side by side in a second direction and the third sub-pixel and the second sub-pixel are arranged side by side in the second direction, and at least one of the first sub-pixel, the second sub-pixel, and the third sub-pixel comprises two pixel blocks;

the third sub-pixel comprises two or more pixel blocks arranged side by side in the first direction.

7. A display device comprising the display panel according to claim 1.

* * * * *